(12) United States Patent
Kim et al.

(10) Patent No.: US 9,640,591 B2
(45) Date of Patent: May 2, 2017

(54) METHOD OF MANUFACTURING ORGANIC LIGHT EMITTING DISPLAY DEVICE

(71) Applicant: LG DISPLAY CO., LTD., Seoul (KR)

(72) Inventors: Mi-Na Kim, Seoul (KR); Kwang Hyun Kim, Daegu (KR); Jin Ho Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/728,221

(22) Filed: Jun. 2, 2015

(65) Prior Publication Data

US 2015/0263075 A1    Sep. 17, 2015

Related U.S. Application Data

(62) Division of application No. 13/720,669, filed on Dec. 19, 2012, now Pat. No. 9,065,052.

(30) Foreign Application Priority Data

Oct. 31, 2012  (KR) ........................ 10-2012-0121726

(51) Int. Cl.
*H01L 27/32* (2006.01)
*H01L 51/00* (2006.01)
(Continued)

(52) U.S. Cl.
CPC ...... *H01L 27/3211* (2013.01); *H01L 51/0001* (2013.01); *H01L 51/0021* (2013.01);
(Continued)

(58) Field of Classification Search
CPC ............. H01L 27/3211; H01L 51/0011; H01L 51/5012; H01L 51/5265; H01L 51/0037;
(Continued)

(56) References Cited

U.S. PATENT DOCUMENTS 6,924,025 B2 * 8/2005 Humbs ............... H01L 27/3211
                                                              257/40
7,470,933 B2   12/2008 Lee et al.
(Continued)

FOREIGN PATENT DOCUMENTS

KR   10-2011-0028716 A    3/2011
WO   WO 2006/078005 A1    7/2006

*Primary Examiner* — Bradley K Smith
*Assistant Examiner* — David Goodwin
(74) *Attorney, Agent, or Firm* — Birch, Stewart, Kolasch & Birch, LLP

(57) ABSTRACT

A method of manufacturing an organic light emitting display device. The method according to one embodiment includes forming a first electrode over a substrate in which red, green, and blue pixel areas are defined; forming a first hole transporting layer on the first electrode; forming a second hole transporting layer in a position corresponding to the red pixel area; forming a first emission common layer; forming a third hole transporting layer on the first emission common layer in a position corresponding to the green pixel area; forming a second emission common layer; forming a fourth hole transporting layer on the second emission common layer in a position corresponding to the blue pixel area; forming a third emission common layer; forming an electron transporting layer on the third emission common layer; and forming a second electrode on the electron transporting layer.

6 Claims, 3 Drawing Sheets

(51) Int. Cl.
　　*H01L 51/52* 　　　　(2006.01)
　　*H01L 51/50* 　　　　(2006.01)
　　*H01L 51/56* 　　　　(2006.01)
(52) U.S. Cl.
　　CPC .......... *H01L 51/504* (2013.01); *H01L 51/506* (2013.01); *H01L 51/5064* (2013.01); *H01L 51/5072* (2013.01); *H01L 51/5088* (2013.01); *H01L 51/52* (2013.01); *H01L 51/5203* (2013.01); *H01L 51/5218* (2013.01); *H01L 51/5234* (2013.01); *H01L 51/5265* (2013.01); *H01L 51/5271* (2013.01); *H01L 51/56* (2013.01); *H01L 2251/558* (2013.01)
(58) Field of Classification Search
　　CPC ........... H01L 51/5036; H01L 2227/323; H01L 2251/558; H01L 27/3209
　　See application file for complete search history.

(56) References Cited

U.S. PATENT DOCUMENTS

| | | | |
|---|---|---|---|
| 8,288,784 B2 | 10/2012 | Cho | |
| 8,319,231 B2 | 11/2012 | Kajimoto | |
| 8,338,222 B2* | 12/2012 | Kim | H01L 27/3211 257/40 |
| 8,466,455 B2* | 6/2013 | Burrows | H01L 27/3211 257/103 |
| 8,569,744 B2* | 10/2013 | Weaver | G09G 3/3208 257/40 |
| 2005/0280355 A1 | 12/2005 | Lee et al. | |
| 2007/0075312 A1* | 4/2007 | Chin | H01L 27/3209 257/40 |
| 2010/0090241 A1* | 4/2010 | D'Andrade | H01L 27/3211 257/98 |
| 2011/0297977 A1 | 12/2011 | Kajimoto | |
| 2012/0018712 A1 | 1/2012 | Hamaguchi et al. | |
| 2012/0164772 A1* | 6/2012 | Lee | C23C 14/042 438/34 |
| 2013/0001526 A1* | 1/2013 | Kwak | H01L 51/5265 257/40 |
| 2013/0140535 A1 | 6/2013 | Chu et al. | |
| 2014/0054556 A1* | 2/2014 | Park | H01L 51/5064 257/40 |
| 2014/0151658 A1* | 6/2014 | Lee | H01L 51/5012 257/40 |

* cited by examiner

METHOD OF MANUFACTURING ORGANIC LIGHT EMITTING DISPLAY DEVICE

CROSS-REFERENCE TO RELATED APPLICATIONS

This application is a Divisional of co-pending U.S. patent application Ser. No. 13/720,669 filed on Dec. 19, 2012, which under 35 U.S.C. §119(a) claims the priority benefit of the Korean Patent Application No. 10-2012-0121726 filed on Oct. 31, 2012. The entire contents of all these applications are hereby incorporated by reference in their entirety.

BACKGROUND OF THE INVENTION

Field of the Invention

The present invention relates to an organic light emitting display device and a method of manufacturing the same.

Description of the Related Art

As a type of new flat panel display device, organic light emitting display devices are self-emitting display devices, and have a better viewing angle and contrast ratio than liquid crystal display (LCD) devices. Also, since the organic light emitting display devices do not need a separate backlight, it is possible to lighten and thin the organic light emitting display devices, and the organic light emitting display devices have excellent power consumption compared to LCD devices and the other flat panel display devices. Furthermore, the organic light emitting display devices are driven with a low direct current (DC) voltage, have a fast response time, and are low in manufacturing cost.

In organic light emitting display devices, an electron and a hole are respectively injected from a cathode and an anode into an emitting material layer, and, when an exciton in which the injected electron and hole are combined is shifted from an excited state to a base state, light is emitted. In this case, the types of organic light emitting display devices are categorized into a top emission type, a bottom emission type, and a dual emission type according to an emission direction of light, and categorized into a passive matrix type and an active matrix type according to a driving type.

Specifically, the organic light emitting display devices includes a first electrode (anode), a hole transporting layer, an emitting material layer including a red organic emission pattern, a green organic emission pattern, and a blue organic emission pattern, an electron transporting layer, and a second electrode (cathode), which are formed in each of a red pixel area (Rp), a green pixel area (Rg), and a blue pixel area (Rb).

In the organic light emitting display devices having the configuration, when a voltage is applied to the first and second electrodes, a hole moves to the emitting material layer through the hole transporting layer, an electron moves to the emitting material layer through the electron transporting layer, and the hole and the electron are combined in the emitting material layer, thereby emitting light.

In the organic light emitting display devices, a fine metal mask (FMM) process is used for patterning the emitting material layer between two electrodes disposed on a substrate.

However, due to limitations of mask manufacturing technology, it is difficult to apply the FMM process to a large size and high resolution. That is, when the organic light emitting display device is applied to a large area, a mask sags due to the weight thereof, and thus, it is difficult to form a desired pattern. Also, the spread of organic materials increases due to a separated distance between the mask and a deposition portion, and therefore, it is difficult to realize high resolution.

For this reason, various methods of manufacturing a high-resolution organic light emitting display device are required.

SUMMARY OF THE INVENTION

Accordingly, the present invention is directed to an organic light emitting display device and a method of manufacturing the same that substantially obviate one or more problems due to limitations and disadvantages of the related art.

An aspect of the present invention is directed to an high-resolution organic light emitting display device for realizing excellent light output efficiency, maintaining color characteristic, simplifying a process, and saving the manufacturing cost.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic light emitting display device including: a substrate, red, green, and blue pixel areas being defined in the substrate; a first electrode and a first hole transporting layer that are formed on the substrate; first to third emission common layers formed in each of the pixel areas, on the first hole transporting layer; and an electron transporting layer and a second electrode that are formed on the third emission common layer.

In another aspect of the present invention, there is provided a method of manufacturing an organic light emitting display device which includes: forming a first electrode over a substrate in which red, green, and blue pixel areas are defined; forming a first hole transporting layer on the first electrode; forming a second hole transporting layer on the first hole transporting layer in a position corresponding to the red pixel area; forming a first emission common layer on the second hole transporting layer and the first hole transporting layer in respective positions corresponding to the green and blue pixel areas; forming a third hole transporting layer on the first emission common layer in a position corresponding to the green pixel area; forming a second emission common layer on the third hole transporting layer and the first emission common layer in respective positions corresponding to the red and blue pixel areas; forming a fourth hole transporting layer on the second emission common layer in a position corresponding to the blue pixel area; forming a third emission common layer on the fourth hole transporting layer and the second emission common layer in respective positions corresponding to the red and green pixel areas; forming an electron transporting layer on the third emission common layer; and forming a second electrode on the electron transporting layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
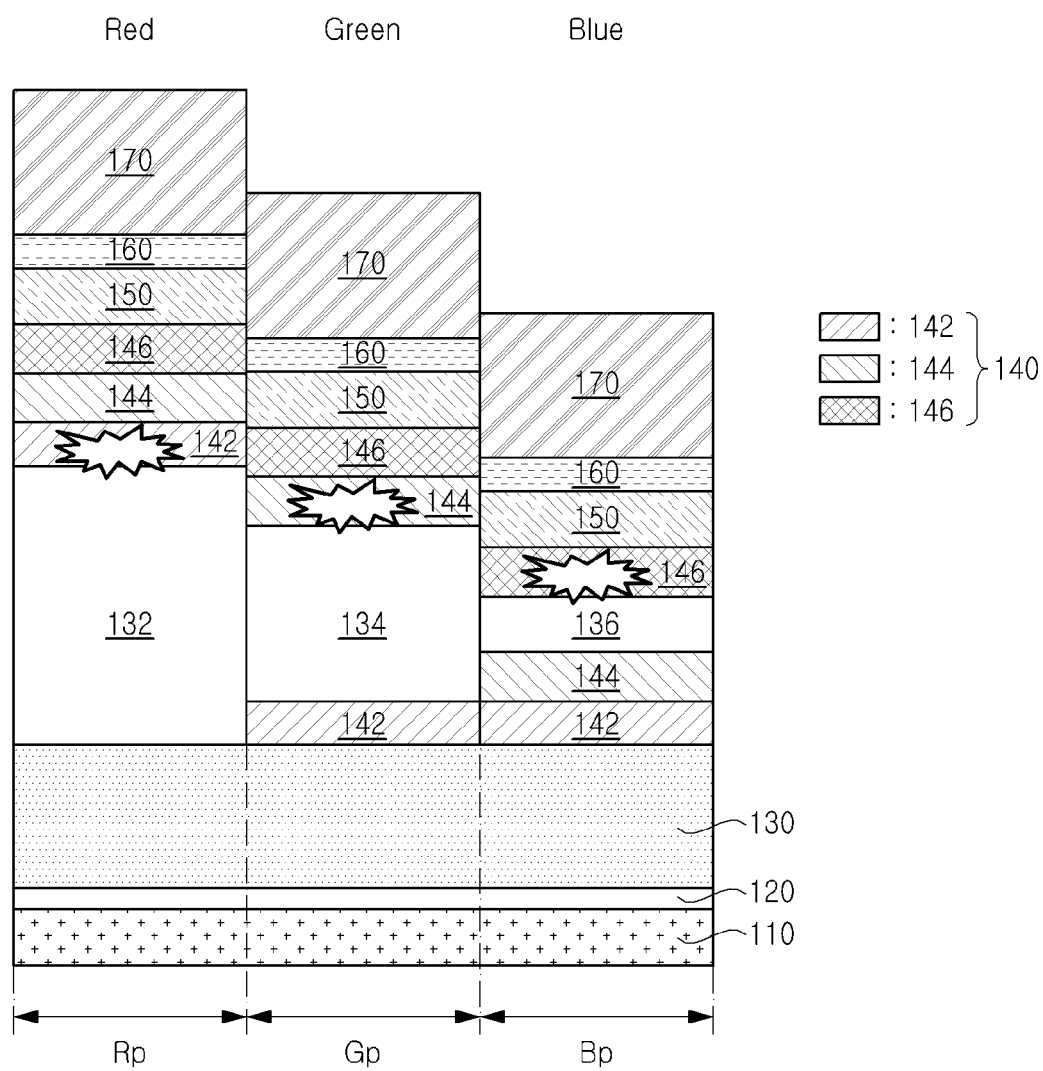
FIG. 1 is a sectional view schematically illustrating an organic light emitting display device according to an embodiment of the present invention.

Hereinafter, embodiments of the present invention will be described in detail with reference to the accompanying drawings. Like reference numerals refer to like elements throughout. In the following description, when the detailed description of the relevant known function or configuration is determined to unnecessarily obscure the important point of the present invention, the detailed description is not provided.

FIG. 1 is a sectional view schematically illustrating an organic light emitting display device according to an embodiment of the present invention.

As illustrated in FIG. 1, the organic light emitting display device includes a first electrode (anode) 110, a hole injection layer 120, a first hole transporting layer 130, a second hole transporting layer 132, a third hole transporting layer 134, a fourth hole transporting layer 136, an emitting material layer 140 including first to third emission common layers 142, 144 and 146, an electron transporting layer 150, a second electrode (cathode) 160, and a capping layer 170 that are stacked on a substrate (not shown) in which a red pixel Rp, a green pixel area Gp, and a blue pixel area Bp are defined.

Although not shown, in the organic light emitting display device, a plurality of gate lines and a plurality of data lines, which define a plurality of pixel areas Rp, Gp, and Bp by intersections therebetween, and a plurality of power lines that are extended in parallel to respective corresponding lines among the gate lines and the data lines are disposed on the substrate (not shown). A switching thin film transistor (TFT) connected to a corresponding gate line and data line and a driving TFT connected to the switching TFT are disposed in each of the pixel areas Rp, Gp, and Bp. Here, the driving TFT is connected to the first electrode 110.

In an embodiment, the organic light emitting display device includes an organic layer between the first electrode 110 and the second electrode 160 facing the first electrode 110. The organic layer includes the hole injection layer 120, the first hole transporting layer 130, the second hole transporting layer 132, the third hole transporting layer 134, the fourth hole transporting layer 136, the emitting material layer 140 including the first to third emission common layers 142, 144 and 146, and the electron transporting layer 150. Here, the first emission common layer 142 may be formed of a red organic material, the second emission common layer 144 may be formed of a green organic material, and the third emission common layer 146 may be formed of a blue organic material.

The first electrode 110 is formed in a plate shape in the red pixel area Rp, the green pixel area Gp, and the blue pixel area Bp, on the substrate (not shown). The first electrode 110 is a reflective electrode, and for example, may have a multi-layer structure that includes a transparent conductive material layer (having a high work function) such as indium tin oxide (ITO) and a reflective material layer such as Ag or an Ag alloy.

The hole injection layer 120 and the first hole transporting layer 130 are formed on the first electrode 110 in respective positions corresponding to the red pixel area Rp, the green pixel area Gp, and the blue pixel area Bp. The first hole transporting layer 130 may be called a common layer, and the hole injection layer 120 may not be provided. A thickness of the hole injection layer 120 and first hole transporting layer 130 may be about 100 Å to about 600 Å, but may be adjusted in consideration of hole injection characteristic and hole transport characteristic.

The second hole transporting layer 132 is formed on the first hole transporting layer 130 in a position corresponding to the red pixel area Rp. That is, the second hole transporting layer 132 is formed between the first hole transporting layer 130 and the first emission common layer 142. A thickness of the second hole transporting layer 132 may be about 100 Å to about 1100 Å, but may be adjusted in consideration of hole transport characteristic. Alternatively, the second hole transporting layer 132 may not be provided.

The third hole transporting layer 134 is formed on the first emission common layer 142 in a position corresponding to the green pixel area Gp. That is, the third hole transporting layer 134 is formed between the first emission common layer 142 and the second emission common layer 144. A thickness of the third hole transporting layer 134 may be about 100 Å to about 750 Å, but may be adjusted in consideration of hole transport characteristic. Alternatively, the third hole transporting layer 134 may not be provided.

The fourth hole transporting layer 136 is formed on the second emission common layer 144 in a position corresponding to the blue pixel area Bp. That is, the fourth hole transporting layer 136 is formed between the second emission common layer 144 and the third emission common layer 146. A thickness of the fourth hole transporting layer 136 may be about 100 Å to about 400 Å, but may be adjusted in consideration of hole transport characteristic. Alternatively, the fourth hole transporting layer 136 may not be provided.

In an embodiment, a thickness of the third transporting layer 134 may be less than that of the second hole transporting layer 132 and greater than that of the fourth hole transporting layer 136, but the spirit and scope of the present invention are not limited thereto.

The emitting material layer 140 is formed in respective positions corresponding to the red pixel area Rp, the green pixel area Gp, and the blue pixel area Bp. That is, an emitting material layer 140 is formed as a common layer in each pixel area, and thus, the emitting material layer 140 may be formed even without an FMM.

In an embodiment, the first emission common layer 142 is formed on the second hole transporting layer 132 and the first hole transporting layer 130 that is disposed in respective positions corresponding to the green and blue pixel areas Gp and Bp. The second emission common layer 144 is formed on the third hole transporting layer 134 and the first emission common layer 142 that is disposed in respective positions corresponding to the red and blue pixel areas Rp and Bp. The third emission common layer 146 is formed on the fourth hole transporting layer 136 and the second emission common layer 144 that is disposed in respective positions corresponding to the red and green pixel areas Rp and Gp.

The first to third emission common layers 142, 144 and 146 may be formed to have the same thickness. For example, the thickness of each of the first to third emission common layers 142, 144 and 146 may be about 100 Å to about 400 Å, but may be adjusted in consideration of emission characteristic.

The electron transporting layer 150 is formed on the third emission common layer 146 in respective positions corresponding to the red pixel area Rp, the green pixel area Gp, and thus may be called a common layer. A thickness of the electron transporting layer 150 may be about 250 Å to about 350 Å, but may be adjusted in consideration of electron transport characteristic. The electron transporting layer 150 may act as an electron transport and injection layer, but an electron injection layer may be separately formed on the electron transporting layer 150.

The second electrode 160 is formed on the electron transporting layer 150. For example, the second electrode 160 is formed of an alloy (Mg:Ag) of Mg and Ag, and has semi-transmissive characteristic. That is, light emitted from the emitting material layer 140 is transferred to the outside through the second electrode 160, in which case some of the light is again transferred to the first electrode 110 because the second electrode 160 has semi-transmissive characteristic.

Therefore, repetitive reflection is performed between the first electrode 110 (acting as a reflective electrode) and the second electrode 160. This is called the micro-cavity effect. That is, light is repeatedly reflected in a cavity between an anode (which is the first electrode 110) and a cathode that is the second electrode 160, thereby increasing light efficiency.

In this case, light respectively emitted from the first to third emission common layers 142, 144 and 146 has different wavelengths, and thus, a thickness "d" of a cavity defined as a distance between the first and second electrodes 110 and 160 is differently set. That is, the thickness "d" of the green pixel area Gp is less than that of the red pixel area Rp that emits red light having the longest wavelength, and greater than that of the blue pixel area Bp that emits blue light having the shortest wavelength.

In the present invention, therefore, distances between the first and second electrodes 110 and 160 are differently formed by adjusting the respective thicknesses of the second to fourth hole transporting layers 132, 134 and 136. That is, the thickness of the third hole transporting layer 134 is less than that of the second hole transporting layer 132, and greater than that of the fourth hole transporting layer 136.

The capping layer 170 increases a light extraction effect, and may be formed of one of materials of the first to fourth hole transporting layers 130, 132, 134 and 136, a material of the electron transporting layer 150, and host materials of the red, green, and blue emission common layers 142, 144 and 146. Alternatively, the capping layer 170 may not be provided.

As described above, the organic light emitting display device according to an embodiment of the present invention maintains light output efficiency and color characteristic, and simultaneously realizes a high-quality image.

However, the FMM having an opening is used in correspondence with each pixel area, forming a material pattern in each of the pixel areas Rp, Gp and Bp. In this case, a process using the FMM is needed in a separate chamber, for forming the second to fourth hole transporting layers 132, 134 and 136 having different thicknesses.

First, the first electrode 110 is formed, and then, the hole injection layer 120 and the first hole transporting layer 130 are formed without the FMM in a first chamber. In the hole injection layer 120, a P-type dopant, for example, boron (B) may be doped into the material of the first hole transporting layer 130.

Subsequently, the second hole transporting layer 132 is formed in the red pixel area Rp by using a first FMM in a second chamber. In the second hole transporting layer 132, a P-type dopant, for example, boron (B) may be doped into the material of the first hole transporting layer 130.

Subsequently, the first emission common layer 142 is formed of a red organic material without the FMM in a third chamber.

Subsequently, the third hole transporting layer 134 is formed in the green pixel area Gp by using a second FMM in a fourth chamber. In the third hole transporting layer 134, a P-type dopant, for example, boron (B) may be doped into the material of the first hole transporting layer 130.

Subsequently, the second emission common layer 144 is formed of a red organic material without the FMM in a fifth chamber.

Subsequently, the fourth hole transporting layer 136 is formed in the blue pixel area Bp by using a third FMM in a sixth chamber. In the fourth hole transporting layer 136, a P-type dopant, for example, boron (B) may be doped into the material of the first hole transporting layer 130.

Subsequently, the third emission common layer 146 is formed of a blue organic material without the FMM in a seventh chamber.

Finally, the electron transporting layer 150, the second electrode 160, and the capping layer 170 are sequentially formed without the FMM in eighth to tenth chambers, respectively.

That is, a process may be performed using only three FMMs in a total of ten chambers, for implementing the micro-cavity structure.

As described above, the organic light emitting display device according to an embodiment of the present invention can solve problems due to a defective mask, simplify a process, and save the manufacturing cost.

Figure 2:
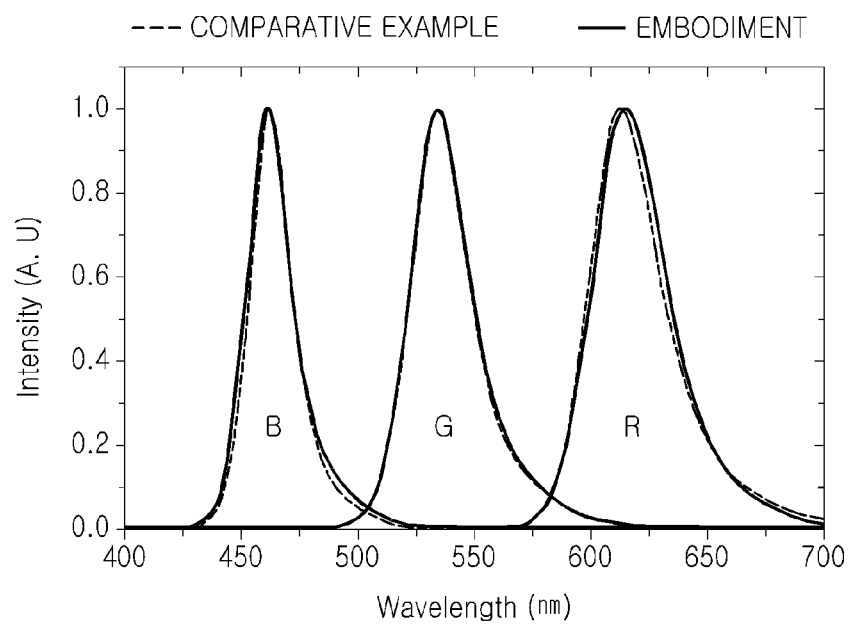
FIG. 2 is a view showing comparison of emission spectrums of respective organic light emitting display devices according to a comparative example and an embodiment.

FIG. 2 and Table 1 show comparison of emission spectrums of respective organic light emitting display devices according to a comparative example and an embodiment.

TABLE 1

|  |  | Result | | |
| --- | --- | --- | --- | --- |
| Division |  | Intensity | CIE_x | CIE_y |
| Red (R) | Comparative example | 1 | 0.658 | 0.340 |
|  | Embodiment | 0.98 | 0.659 | 0.339 |
| Green (G) | Comparative example | 1 | 0.257 | 0.710 |
|  | Embodiment | 1.02 | 0.259 | 0.709 |
| Blue (B) | Comparative example | 1 | 0.138 | 0.056 |
|  | Embodiment | 0.99 | 0.139 | 0.056 |

As shown in FIG. 2 and Table 1, it can be seen that the comparative example and an embodiment hardly have a color characteristic difference in emission spectrums in respective pixel areas Rp, Gp and Bp.

Here, the comparative example (illustrated as a dotted line) denotes a case in which a red emission layer, a green emission layer, and a blue emission layer are stacked as a single layer in each pixel area, and an embodiment (illustrated as a solid line) denotes a structure according to an embodiment of the present invention. That is, the structure is a structure in which the red, green, and blue emission layers are all included in each pixel area, in which case the red, green, and blue emission layers are sequentially stacked trebly in the red pixel area Rp, the green and blue emission layers are sequentially stacked doubly in the green pixel area Gp, and the red and green emission layers are sequentially stacked doubly in the blue pixel area Bp.

In this case, an energy band gap of the green emission layer is greater than that of the red emission layer, and less than that of the blue emission layer. That is, an electron and a hole are first combined to emit light in a layer having a broad energy band gap, and then, when an electron and a hole are again combined in a layer having an energy band gap narrower than the broad energy band gap, light may be emitted. However, an electron and a hole are first combined to emit light in a layer having a narrow energy band gap, and then, when an electron and a hole are again combined in a layer having an energy band gap broader than the narrow energy band gap, light cannot be emitted.

Therefore, as in the red pixel area Rp of FIG. 1, in a structure in which the red, green, and blue emission layers are sequentially stacked between the first and second electrodes 110 and 160, an electron and a hole are combined to emit light in the red emission layer, and then, light is not emitted from the green and blue emission layers.

Moreover, as in the green pixel area Gp of FIG. 1, in a structure in which the green and blue emission layers are sequentially stacked between the first and second electrodes 110 and 160, an electron and a hole are combined to emit light in the green emission layer, and then, light is not emitted from the blue emission layer having a broad energy band gap.

Figure 3:
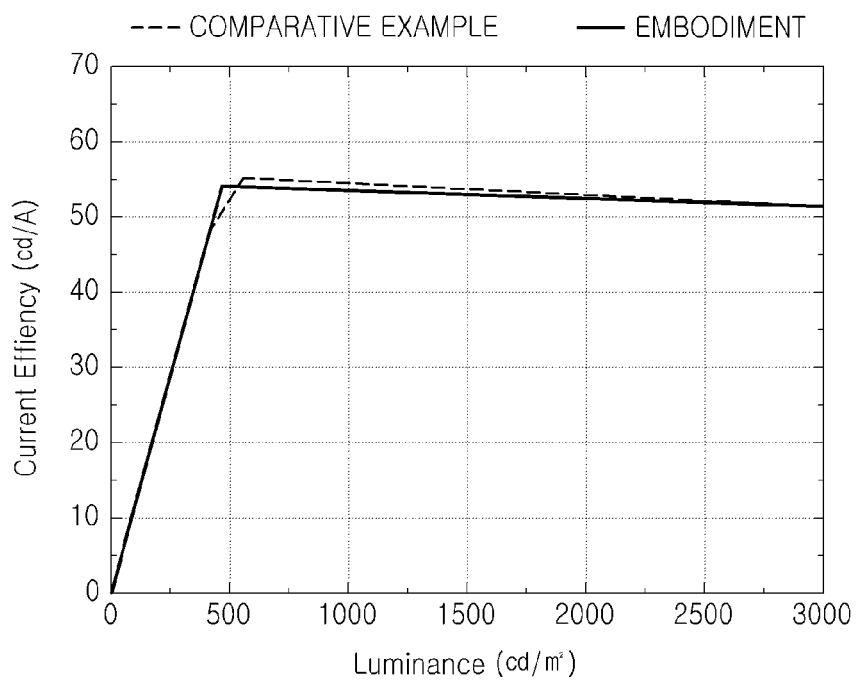
FIGS. 3 to 5 are views showing comparison of efficient characteristics (cd/A) with respect to luminance ($cd/m^2$) of respective organic light emitting display devices according to a comparative example and an embodiment.
Figure 4:
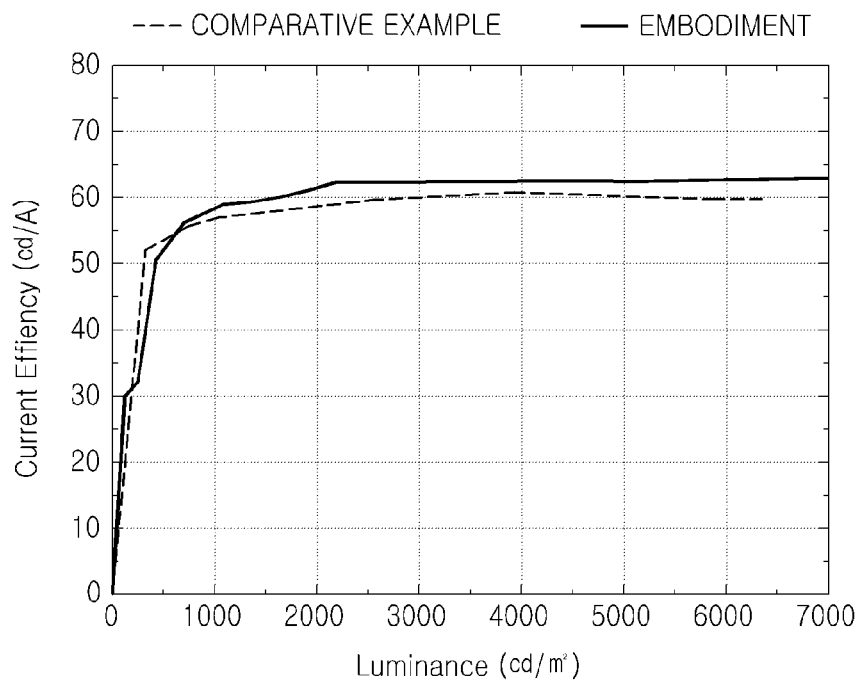
Figure 5:
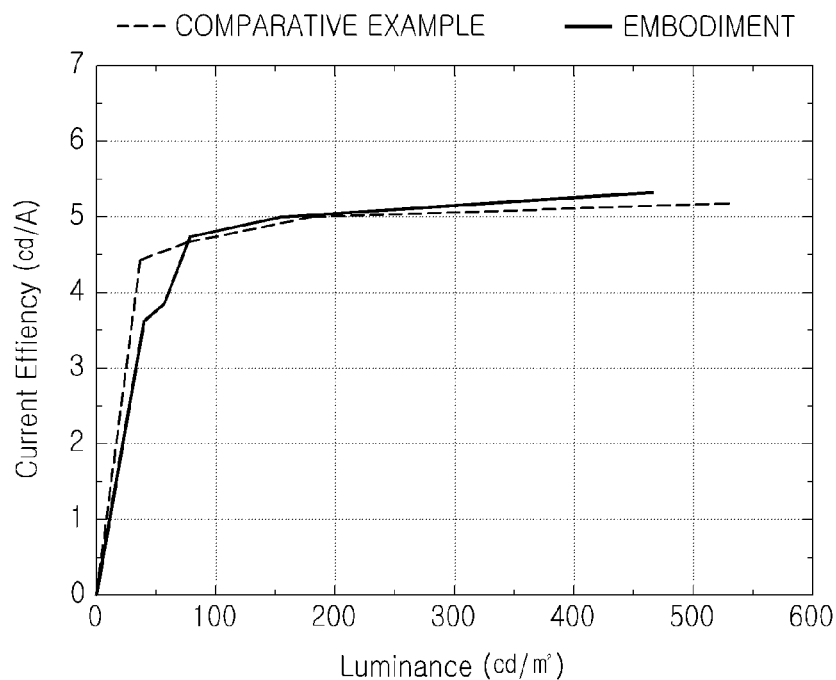

FIGS. 3 to 5 are views showing comparison of efficient characteristics (cd/A) with respect to luminance (cd/m$^2$) of respective organic light emitting display devices according to a comparative example and an embodiment. Here, FIG. 3 shows comparison of efficient characteristics (cd/A) with respect to luminance (cd/m$^2$) in the red pixel area, FIG. 4 shows comparison of efficient characteristics (cd/A) with respect to luminance (cd/m$^2$) in the green pixel area, and FIG. 5 shows comparison of efficient characteristics (cd/A) with respect to luminance (cd/m$^2$) in the blue pixel area.

As shown in FIGS. 3 to 5, it can be seen that the comparative example and an embodiment hardly have an efficient characteristic difference in each of the pixel areas Rp, Gp and Bp.

Therefore, the emitting material layer is stacked as the red, green, or blue emission common layer, but the organic light emitting display device according to an embodiment of the present invention can maintain color characteristic and realize a high-quality image.

In the specification, a top emission type of organic light emitting display device including a plurality of organic light emitting diodes (OLEDs) has been exemplified, but the spirit and scope of the present invention are not limited thereto. The present invention may be applied to organic light emitting display devices having various types such as a bottom emission type, a dual emission type, a tandem type, etc.

According to the present invention, although the red, green, and blue emission layers are formed as the common layers in the red, green, and blue pixel areas, light output efficiency is excellent, and color characteristic is maintained.

Also, it is not required to form a separate emitting material layer in each pixel area, and thus, the emitting material layer is formed without using an FMM. Accordingly, color mixture is prevented, limitations due to a defective mask are overcome, a process is simplified, and the manufacturing cost is saved.

Therefore, the organic light emitting display device according to the present invention can realize high resolution.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of manufacturing an organic light emitting display device, comprising:
   forming a first electrode over a substrate in which red, green, and blue pixel areas are defined;
   forming a first hole transporting layer on the first electrode;
   forming a second hole transporting layer on the first hole transporting layer in a position corresponding to the red pixel area;
   forming a first emission common layer on the second hole transporting layer and the first hole transporting layer in respective positions corresponding to the green and blue pixel areas;
   forming a third hole transporting layer on the first emission common layer in a position corresponding to the green pixel area;
   forming a second emission common layer on the third hole transporting layer and the first emission common layer in respective positions corresponding to the red and blue pixel areas;
   forming a fourth hole transporting layer on the second emission common layer in a position corresponding to the blue pixel area;
   forming a third emission common layer on the fourth hole transporting layer and the second emission common layer in respective positions corresponding to the red and green pixel areas;
   forming an electron transporting layer on the third emission common layer; and
   forming a second electrode on the electron transporting layer.

2. The method of claim 1, further comprising forming, before the forming of a first hole transporting layer, a hole injection layer on the first electrode.

3. The method of claim 1, wherein a thickness of the third hole transporting layer is less than a thickness of the second hole transporting layer, and greater than a thickness of the fourth hole transporting layer.

4. The method of claim 1, wherein the first electrode is a reflective electrode comprising an Ag alloy.

5. The method of claim 1, wherein each of the second, third, and fourth hole transporting layers is formed by doping a P-type dopant into a material forming the first hole transport layer.

6. The method of claim 1, wherein,
   the first electrode is a reflective electrode, and
   the second electrode has a semi-transparent characteristic.

* * * * *